United States Patent
Kanamori

(10) Patent No.: US 7,192,840 B2
(45) Date of Patent: Mar. 20, 2007

(54) SEMICONDUCTOR DEVICE FABRICATION METHOD USING OXYGEN ION IMPLANTATION

(75) Inventor: Jun Kanamori, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 128 days.

(21) Appl. No.: 10/634,851

(22) Filed: Aug. 6, 2003

(65) Prior Publication Data
US 2004/0087103 A1   May 6, 2004

(30) Foreign Application Priority Data
Oct. 30, 2002   (JP)   .............................. 2002-315882

(51) Int. Cl.
*H01L 21/76* (2006.01)
(52) U.S. Cl. ................ 438/439; 438/440; 257/E21.552
(58) Field of Classification Search ................ 438/449, 438/450, 452, 524, 546, 547, 561, 466, 769, 438/770, 42, 225, 297, 298, 362, 423, 426, 438/433, 439, 440, 444, 445, 447, 434, 766; 257/E21.545, E21.552
See application file for complete search history.

(56) References Cited

U.S. PATENT DOCUMENTS

| | | | | | |
|---|---|---|---|---|---|
| 4,437,225 | A | * | 3/1984 | Mizutani .................... | 438/480 |
| 4,523,963 | A | * | 6/1985 | Ohta et al. ................. | 438/162 |
| 5,141,882 | A | * | 8/1992 | Komori et al. | |
| 5,416,043 | A | * | 5/1995 | Burgener et al. | |
| 5,422,287 | A | * | 6/1995 | So ............................ | 438/165 |
| 5,712,173 | A | * | 1/1998 | Liu et al. ................... | 438/297 |
| 5,739,574 | A | * | 4/1998 | Nakamura | |
| 5,780,352 | A | * | 7/1998 | Park et al. ................. | 438/404 |
| 5,807,784 | A | * | 9/1998 | Kim .......................... | 438/423 |
| 5,863,823 | A | * | 1/1999 | Burgener | |
| 5,869,359 | A | * | 2/1999 | Prabhakar .................. | 438/149 |
| 5,972,776 | A | * | 10/1999 | Bryant ....................... | 438/440 |
| 6,001,709 | A | * | 12/1999 | Chuang et al. ............. | 438/440 |
| 6,066,530 | A | * | 5/2000 | Templeton et al. ........ | 438/257 |
| 6,069,054 | A | * | 5/2000 | Choi .......................... | 438/423 |

(Continued)

FOREIGN PATENT DOCUMENTS

JP        63-152155        6/1988

(Continued)

OTHER PUBLICATIONS

Stanley Wolf and Richard N. Tauber, Silicon Processing For The VLSI Era, 2000, Lattice Press, Second Edition, p. 19.*

(Continued)

*Primary Examiner*—Michael Lebentritt
*Assistant Examiner*—Stanetta Isaac
(74) *Attorney, Agent, or Firm*—Rabin & Berdo, PC

(57) ABSTRACT

A method of fabricating a semiconductor device having a silicon layer disposed on an insulating film. Oxygen ions are implanted into selected parts of the silicon layer, which are then oxidized to form isolation regions dividing the silicon layer into a plurality of mutually isolated active regions. As the oxidation process does not create steep vertical discontinuities, fine patterns can be formed easily on the combined surface of the active and isolation regions. The implanted oxygen ions cause oxidation to proceed quickly, finishing before a pronounced bird's beak is formed. The isolation regions themselves can therefore be narrow and finely patterned.

13 Claims, 4 Drawing Sheets

U.S. PATENT DOCUMENTS

| | | | |
|---|---|---|---|
| 6,190,952 B1* | 2/2001 | Xiang et al. | |
| 6,221,732 B1* | 4/2001 | Kaneko | 438/405 |
| 6,258,694 B1* | 7/2001 | Wang et al. | 438/423 |
| 6,277,684 B1* | 8/2001 | Hayashi et al. | 438/225 |
| 6,316,804 B1* | 11/2001 | Templeton et al. | 257/315 |
| 6,387,741 B1* | 5/2002 | Kawano | 438/165 |
| 6,433,388 B2* | 8/2002 | Kanamori | 257/347 |
| 6,501,133 B1* | 12/2002 | Fujiwara | 257/347 |
| 6,528,387 B1* | 3/2003 | Moriyasu et al. | 438/404 |
| 6,583,474 B2* | 6/2003 | Yamasaki et al. | |
| 6,593,173 B1* | 7/2003 | Anc et al. | 438/149 |
| 6,596,593 B2* | 7/2003 | Ishii | 438/275 |
| 6,673,660 B2* | 1/2004 | Komatsubara | 438/156 |
| 6,686,255 B2* | 2/2004 | Yang et al. | 438/439 |
| 6,724,049 B2* | 4/2004 | Fujiwara | 257/354 |
| 6,828,206 B2* | 12/2004 | Kanamori | |
| 2001/0001497 A1* | 5/2001 | Utsunomiya et al. | 257/355 |
| 2001/0036710 A1* | 11/2001 | Hayashi et al. | 438/439 |
| 2002/0048899 A1* | 4/2002 | Lunenborg et al. | 438/449 |
| 2003/0022461 A1* | 1/2003 | Yang et al. | 438/439 |
| 2003/0068870 A1* | 4/2003 | Komatsubara | 438/449 |
| 2003/0178679 A1* | 9/2003 | Uehara et al. | 257/347 |
| 2003/0186511 A1* | 10/2003 | Yiu et al. | 438/400 |

FOREIGN PATENT DOCUMENTS

| | | |
|---|---|---|
| JP | 2-103951 | 4/1990 |
| JP | 05-121399 | 5/1993 |
| JP | 06-310534 | 11/1994 |
| JP | 07-022504 | 1/1995 |
| JP | 8-46026 | 2/1996 |
| JP | 08-340045 | 12/1996 |
| JP | 9-330920 | 12/1997 |
| JP | 10-135323 | 5/1998 |
| JP | 10-144678 | 5/1998 |
| JP | 10-189571 | 7/1998 |
| JP | 11-67753 | 3/1999 |
| JP | 11-186253 | 7/1999 |
| JP | 2001-358209 | 12/2001 |
| JP | 2002-176049 | 6/2002 |

OTHER PUBLICATIONS

Stanley Wolf and Richard N. Tauber, Silicon Processing For The VLSI Era, 2000, Lattice Press, Second Edition, p. 19.*

* cited by examiner

SEMICONDUCTOR DEVICE FABRICATION METHOD USING OXYGEN ION IMPLANTATION

BACKGROUND OF THE INVENTION

1. Field of the Invention

The present invention relates to a semiconductor device fabrication method, and more particularly to the isolation steps in the fabrication method.

2. Description of the Related Art

The most generally used method of isolating circuit elements in a semiconductor device has been local oxidation of silicon (LOCOS) and a variant of this method known as framed local oxidation of silicon (F-LOCOS). In a further variant, proposed in Japanese Unexamined Patent Application Publication No. 7-22504, oxygen ions are implanted into a silicon substrate to form a buried oxide layer (a pad oxide) while maintaining the monocrystalline structure of the silicon above, and this monocrystalline silicon is then selectively oxidized to form a field oxide with smooth transition or 'bird's-beak' regions.

Japanese Unexamined Patent Application Publication No. 6-310534 discloses another method in which an impurity of an opposite type to the source and drain type is implanted into the substrate after the field oxide has been formed. For an n-channel transistor, for example, ions of a p-type impurity such as boron ($B^+$) or boron difluoride ($BF_2^+$) may be implanted. This implantation determines the carrier density in the substrate, and thus the threshold voltage of the transistor, and avoids having the carrier density altered by the oxidation process that forms the field oxide. In particular, the impurity concentration near the interface between the active element region and the field oxide can be reliably controlled.

The LOCOS process and its variants do not work well in devices with features as small as, for example 0.15 micrometer (0.15 μm). An alternative process that has come into use at these small geometries is shallow trench isolation (STI), but this process has turned out to be highly problematic when applied to devices having a silicon-on-insulator (SOI) structure, because it stresses the thin silicon layer, greatly degrading the electrical characteristics of the circuit elements formed therein. In particular, STI cannot be used in fully depleted SOI devices in which the silicon layer may be only forty nanometers (40 nm) thick, or less.

For SOI devices, accordingly, alternative isolation methods have been tried, such as the mesa isolation method, in which a thin layer of silicon is etched to form isolated mesas of silicon on an insulating layer. The etching process is illustrated in FIGS. 5A and 5B. An SOI substrate 200 comprising a silicon supporting layer 202, a buried oxide layer 204, and a silicon semiconductor layer 206 is covered with a photoresist film 212 which is patterned by photolithography as shown in FIG. 5A to define the mesa shapes. The silicon semiconductor layer 206 is then etched, with the patterned photoresist functioning as an etching mask. FIG. 5B shows the adjacent parts of two mesas after the photoresist mask has been removed and the surface cleansed. The etching process also removes part of the buried oxide layer 204.

A problem with mesa isolation is that although the silicon semiconductor layer 206 may be thin, its thickness is not so small as to be entirely negligible, and the edges of the mesas are steep. The steep edges create problems in subsequent patterning processes, such as the patterning of gate electrodes by photolithography. In particular, extremely precise photolithography will be required for the formation of gate electrodes with gate lengths of 0.1 μm or less. At these dimensions, the edges of the mesas cannot be ignored, especially since the etching process that forms the mesas increases the height of their edges by etching into the insulating layer 204 as well.

SUMMARY OF THE INVENTION

An object of the present invention is accordingly to provide a semiconductor device fabrication method that isolates circuit elements without creating a height difference between active regions and isolation regions, enabling fine patterns to be formed easily on the combined surface of the active and isolation regions.

Another object of the invention is to provide a semiconductor device fabrication method that can isolate circuit elements with finely patterned isolation regions.

The invented method is used to fabricate a semiconductor device having a silicon layer disposed on an insulating layer. After the silicon layer is formed, oxygen ions are implanted into selected parts thereof. These selected parts of the silicon layer are then oxidized to create isolation regions dividing the silicon layer into a plurality of mutually isolated active regions, in which circuit elements such as transistors can be formed.

An oxidation-resistant film such as a nitride film or a photoresist film may be formed on the silicon layer and used as a mask during the ion implantation and oxidation processes.

The oxidation process does not create steep vertical discontinuities between the active regions and isolation regions. Fine patterns can therefore be formed easily on the combined surface of the active and isolation regions.

Since oxygen ions have already been implanted into the silicon layer, the oxidation process proceeds quickly and is completed before extensive lateral oxidation can take place. The transition zone between the isolation regions and active regions is therefore small; no pronounced bird's-beak is formed. This enables the active regions to be adequately isolated from one another by comparatively narrow, finely patterned isolation regions.

DETAILED DESCRIPTION OF THE INVENTION

Figure 1A:
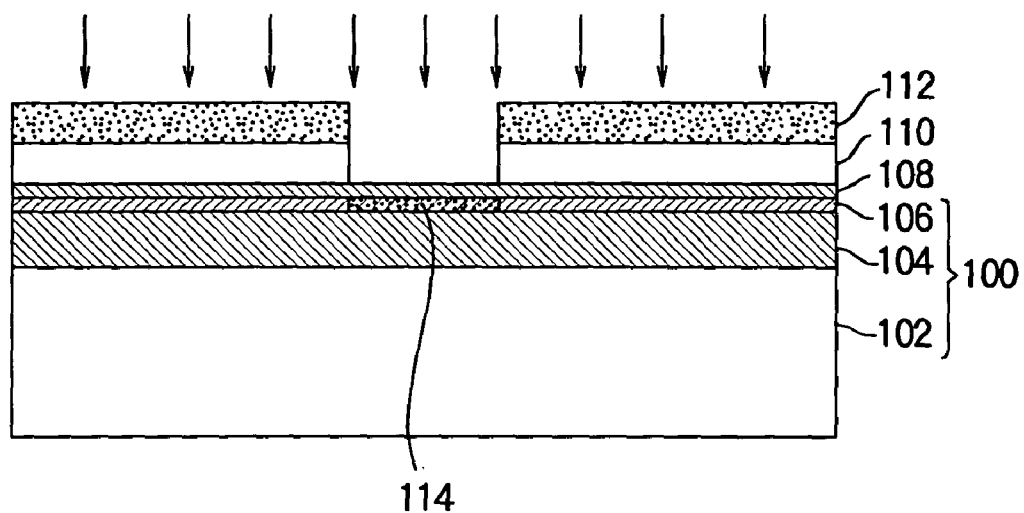
FIGS. 1A and 1B are sectional views illustrating two stages in the fabrication of a semiconductor device according to a first embodiment of the invention.

Embodiments of the invention will be described with reference to the drawings, in which like elements are indicated by like reference numerals.

Figure 1B:
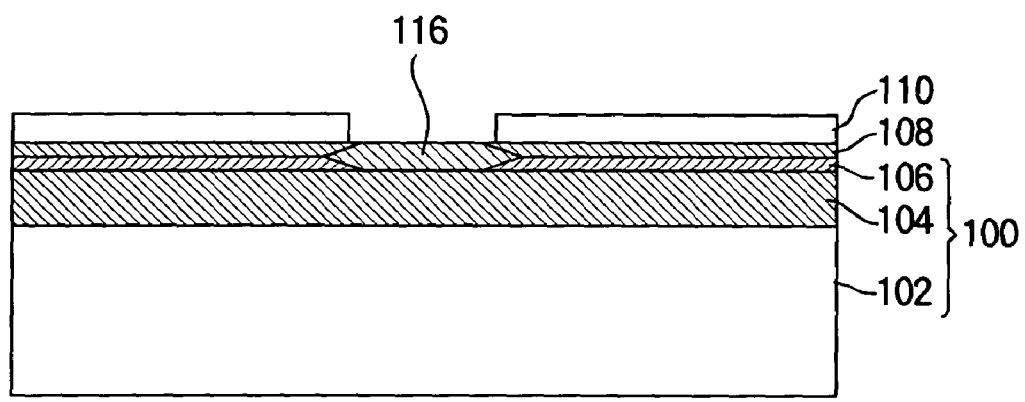

FIGS. 1A and 1B illustrate the isolation steps in a first embodiment of the invention. An SOI substrate 100 comprising a silicon supporting substrate 102, a buried oxide layer 104, and a silicon layer 106 twenty to seventy nanometers thick is thermally oxidized to form a sacrificial oxide film or pad oxide film 108 five to fifty nanometers thick. This thermal oxidation process reduces the thickness of the silicon layer 106 by an amount that can be precalculated; the thicknesses of the silicon layer 106 and pad oxide film 108 should be selected so that the remaining thickness of the silicon layer 106 and the thickness of the pad oxide film 108 are adequate for later fabrication steps. Next, a nitride film 110 ten to three hundred fifty nanometers thick is formed by chemical vapor deposition (CVD). The purpose of the pad oxide film 108 is to prevent direct contact between the silicon layer 106 and the nitride film 110. The surface of the nitride film 110 is then coated with a photoresist film 112, which is patterned by photolithography to define oxygen ion implantation regions. The nitride film 110 and photoresist film 112 are both oxidation-resistant. The nitride film 110 is then etched, the photoresist film 112 being used as a mask, to expose the pad oxide film 108 In the oxygen ion implantation areas. In FIG. 1A, the pad oxide film 108 is not etched. After the etching process, oxygen ions are implanted into the silicon layer 106, with the nitride film 110 and photoresist film 112 both acting as masks. In FIG. 1A, the oxygen ions are Implanted through the pad oxide film 108 with an accelerating voltage of, for example, five kilovolts (5 kV) and a concentration of $10^{14}$ ions/cm$^2$ into the region 114 of the silicon layer 106 disposed below the openings in the nitride film 110 and photoresist film 112.

Next, the photoresist film 112 is removed and a field oxidation process is carried out to form a field oxide film 116 as shown in FIG. 1B. The field oxide film 116 isolates different active regions of the silicon layer 106, in which circuit elements such as transistors will be formed in subsequent fabrication steps (not illustrated). The nitride film 110 and pad oxide film 108 are removed before the circuit elements are formed.

The implantation of oxygen ions in FIG. 1A speeds the formation of the field oxide film 116 in FIG. 1B and reduces its lateral spread. Consequently, it is not necessary to allow an extra margin for a large bird's beak. Adequate isolation can therefore be obtained even if the field oxide film 116 is finely patterned and high levels of integration can be attained. The fabrication time can also be reduced, because of the rapid oxidation of the silicon layer 106. Moreover, since the silicon layer 106 is not etched, no steep vertical edges are formed, removing the problem found in mesa isolation.

The first embodiment is particularly advantageous for fully depleted silicon-on-insulator (FD-SOI) substrates in which the thickness of the silicon layer 106 is 70 nm or less, preferably 40 nm or less. The reason is that since the field oxidation process is completed quickly, it does not stress the thin-silicon layer 106.

Figure 2A:
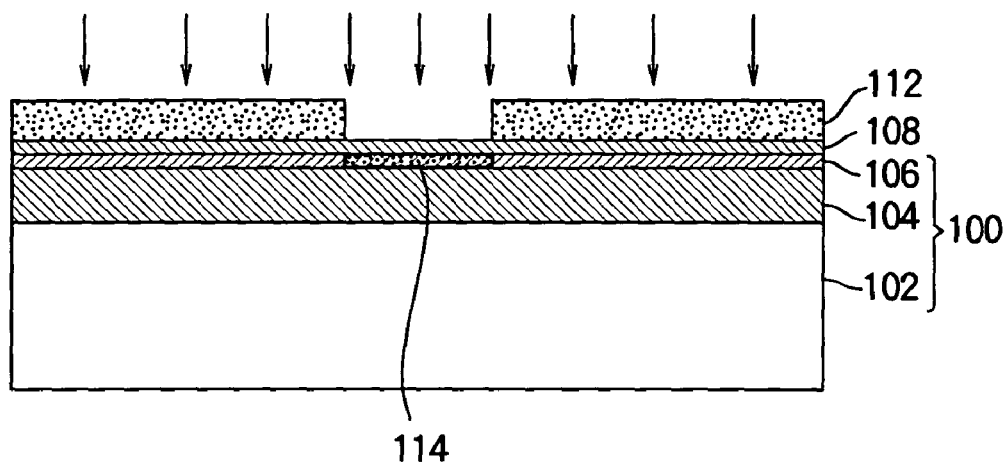
FIGS. 2A and 2B are sectional views illustrating two stages in the fabrication of a semiconductor device according to a second embodiment.
Figure 2B:
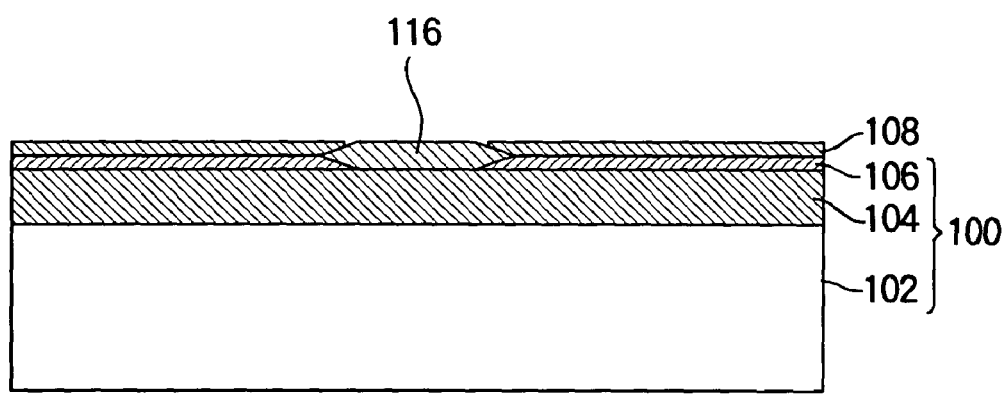

FIGS. 2A and 2B illustrate the isolation steps in a second embodiment of the invention. The second embodiment is identical to the first embodiment except that no nitride film is formed; the photoresist film 112 is applied directly to the pad oxide film 108. The photoresist film 112 acts as a mask during ion implantation in FIG. 2A, and during field oxidation in FIG. 2B.

Compared with the first embodiment, the second embodiment involves fewer process steps, since no nitride film is formed. The absence of the nitride film also prevents oxidation faults even if the isolation pattern is very fine. In the first embodiment, the oxidation resistance effect of the nitride film 110 extends into the edges of the region 114 in which the field oxide 116 will be formed, so oxidation faults may occur, especially if the openings in the nitride film 110 are very narrow. The second embodiment, which uses only the photoresist film 112 as an oxidation mask, avoids such faults, even when the openings in the photoresist film 112 are narrow. The second embodiment thus enables the creation of finer field oxide patterns than in the first embodiment.

Even though there is no nitride film to prevent oxidation of unwanted areas, the pad oxide film 108 tends to prevent unwanted oxidation, by hindering the diffusion of oxygen into these areas. Moreover, due to the implantation of oxygen ions, the field oxidation process is completed quickly, as pointed out in the first embodiment, so any oxidation that may occur in unwanted areas will be slight. Under optimal oxidation conditions, the amount of unwanted oxide formed can be held to 10 nm or less, and the thickness of the silicon layer 106 can be chosen so that this amount of oxidation does not present a problem. For example, if the desired thickness of the silicon layer 106 after field oxidation is 40 nm, the process can be carried out so that the thickness of the silicon layer 106 before the isolation step is 50 nm.

Figure 3A:
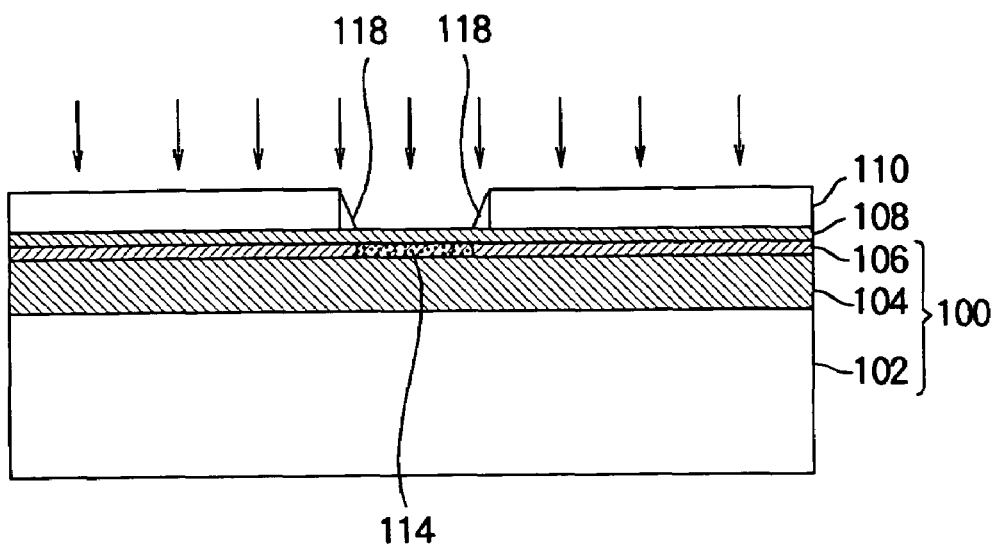
FIGS. 3A, 3B, and 3C are sectional views illustrating three stages in the fabrication of a semiconductor device according to a third embodiment.
Figure 3B:
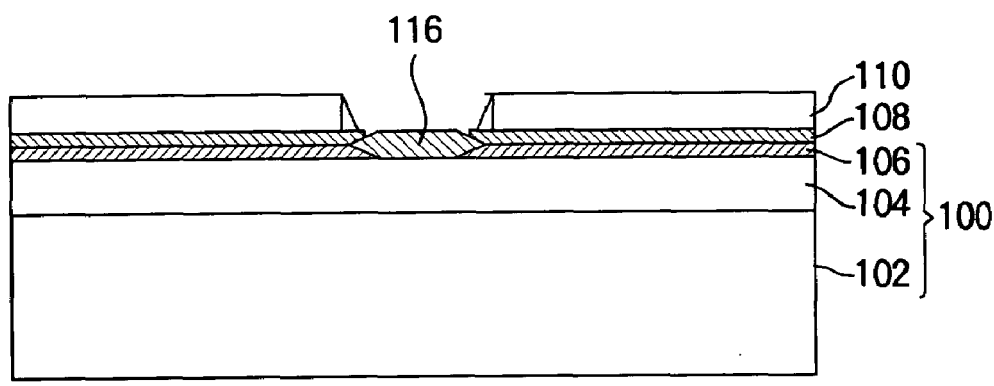
Figure 3C:
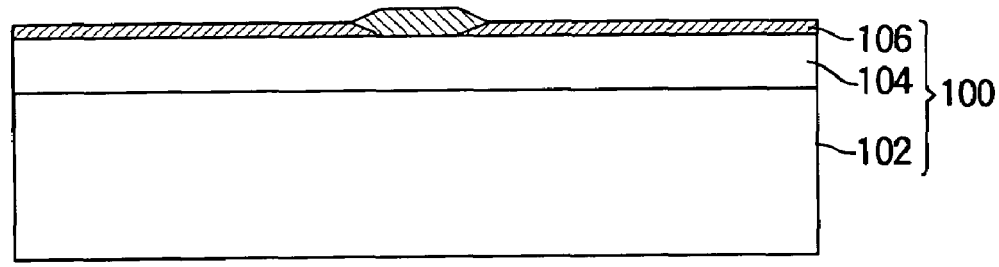

FIGS. 3A to 3C illustrate the isolation steps in a third embodiment of the invention. The isolation process in the third embodiment begins as described in the first embodiment and proceeds in an identical manner through the etching of the nitride film 110. Next, the photoresist film 112 (shown in FIG. 1A) is removed and a nitride film 110 is deposited on the entire surface. This nitride film is etched anisotropically, without a mask, leaving nitride sidewalls 118 on the inner walls of the openings in the nitride film 110, as shown in FIG. 3A. Oxygen ions are then implanted with an accelerating voltage of, for example, 5 kV and a concentration of $10^{14}$ ions/cm$^2$ into a region 114 in the silicon layer 106, with the nitride film 110 and sidewalls 118 functioning as a mask, as indicated by the arrows in FIG. 3A.

Next the surface is cleansed if necessary, and field oxidation is carried out, forming a field oxide film 116 as shown in FIG. 3B. The nitride film 110 and pad oxide film 108 are then removed by any appropriate methods to complete the isolation process, as shown in FIG. 3C.

In the third embodiment, since the openings in the nitride film 110 are narrowed by the sidewalls 118, the region 114 into which oxygen ions are implanted is correspondingly reduced in size. Even if the ion implantation process or the field oxidation process involves a lateral spread in the silicon layer 106, the size of the field oxide film 116 remains comparable to or smaller than the size of the openings in the nitride film 110 defined by photolithography. The third embodiment thus permits the formation of very fine isolation patterns.

The sidewalls 118 of the third embodiment can also be formed when the nitride film 110 is absent as in the second embodiment.

The sidewalls 118 need not be formed from a nitride film; they can be formed from an oxide film instead.

Figure 4:
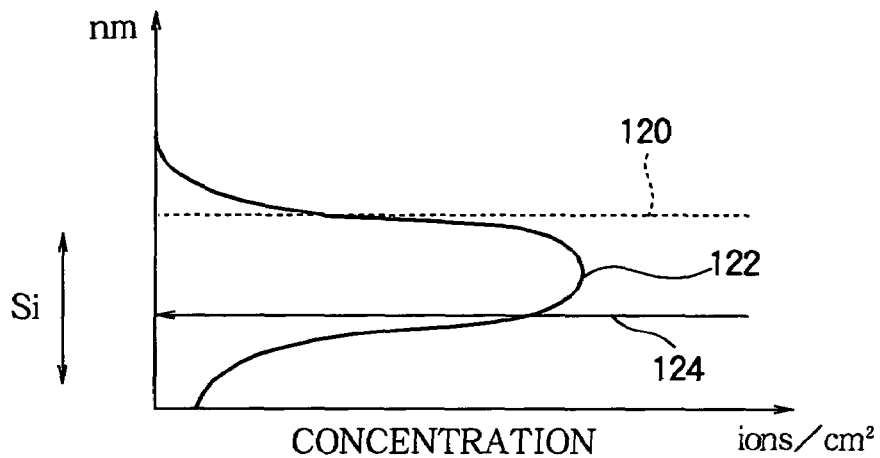
FIG. 4 is a graph illustrating the oxygen ion concentration profile in a semiconductor device fabricated according to a fourth embodiment.
Figure 5A:
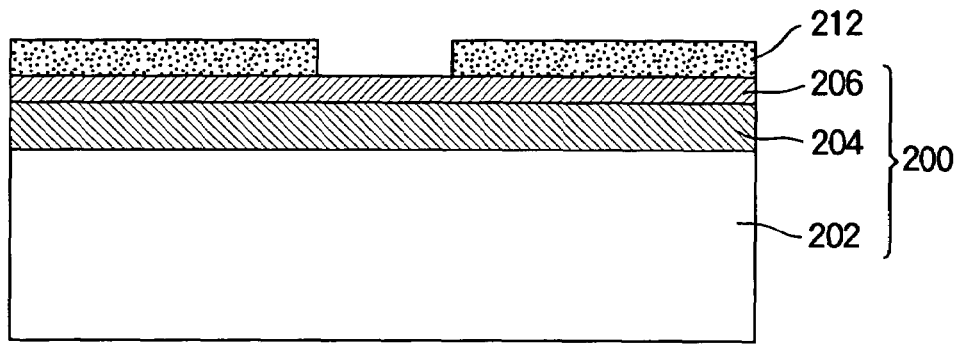
FIGS. 5A and 5B are sectional views illustrating the conventional mesa isolation process.
Figure 5B:
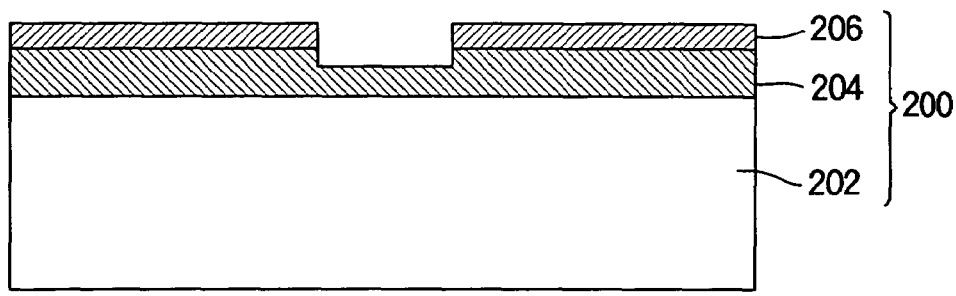

FIG. 4 shows a preferred oxygen concentration profile for the oxygen implantation step in the first, second, and third embodiments. The vertical axis indicates implantation depth in nanometers, the depth increasing with increasing height on the axis. The dotted line 120 represents the interface between the silicon (Si) layer 106 and the buried oxide layer 104; the area below the dotted line 120 represents the thickness of the silicon layer 106. The horizontal axis indicates oxygen ion concentration in ions per square centimeter. The total number of ions implanted into the silicon layer 106 is, for example, $10^{14}$ to $10^{16}$ per square centimeter, but the concentration varies with depth in the silicon layer 106. The peak 122 of the concentration profile occurs at a depth deeper than the center 124 of the silicon layer 106, in the part of the silicon layer 106 relatively near the buried oxide layer 104. As a result, during the field oxidation process, oxidation proceeds to the interface with the buried oxide layer 104, and the silicon layer 106 is adequately oxidized, even in the vicinity of this interface. Possible inadequate isolation due to inadequate oxidation of the silicon layer 106 is thereby avoided.

The method of implanting oxygen into the silicon layer 106 is not limited to the simple use of an accelerating voltage; other methods may be employed. For example, oxygen ions may be excited by plasma excitation, then directed by an electric field into the silicon layer 106.

The pad oxide film 108 or sacrificial oxide was described above as a thermal oxide film 5 to 50 nm thick, but an oxide film formed by chemical vapor deposition (CVD) can be used instead of a thermal oxide film. If a CVD film is used, then when the pad oxide film is removed after field oxidation, the removal process can be completed quickly, so that little of the field oxide film is lost. This simplifies the adjustment of the original thickness of the silicon layer.

The pad oxide film 108 may also be a combination of a thermal oxide film and a CVD film.

The oxygen implantation mask is not limited to the nitride film 110 and photoresist film 112 used in the embodiments above. For example, the pad oxide film may be used as an oxygen implantation mask, or a separate oxide film may be formed and used as a mask.

The invention has been described in the context of a fully depleted SOI device with a silicon layer thickness of, for example 20 to 70 nm, but the invention can also be applied to a partially depleted SOI device with a thicker silicon layer, or to a bulk device.

Those skilled in the art will recognize that further variations are possible within the scope of the invention, which is defined in the appended claims.

What is claimed is:

1. A method of fabricating a semiconductor device, having a silicon layer disposed on an insulating film, the method comprising:
   oxidizing a surface of the silicon layer to form a pad oxide film;
   passing oxygen ions into an upper surface of the pad oxide film, and out of a lower surface of the pad oxide film to implant the oxygen ions into selected parts of the silicon layer that are in direct contact with the lower surface of the pad oxide film, directly under, and completely covered by the pad oxide film, wherein the implanted oxygen ions have a peak concentration in a lower half of the silicon layer, the peak concentration being centered above the insulating film, so that all other concentrations of the implanted oxygen ions, both above and below the lower half of the silicon layer, are less than the peak concentration; and
   oxidizing the selected parts of the silicon layer, into which the oxygen ions have been implanted, and while the selected parts are still covered by the pad oxide film, to form isolation regions dividing the silicon layer into a plurality of mutually isolated active regions.

2. The method of claim 1, wherein the silicon layer has a thickness of at most seventy nanometers.

3. The method of claim 1, wherein the semiconductor device is a fully depleted silicon-on-insulator device.

4. The method of claim 1, wherein the isolation regions are field oxide regions.

5. The method of claim 1, wherein all parts of the silicon layer having oxygen ion implanted therein, including the selected parts, are completely covered by the pad oxide film, and wherein during said oxidizing, the selected parts are completely covered by the pad oxide film.

6. A method of fabricating a semiconductor device, having a silicon layer disposed on an insulating film, the method comprising:
   oxidizing a surface of the silicon layer to form a pad oxide film;
   forming a first oxidation-resistant film on the pad oxide film;
   selectively removing the first oxidation-resistant film from parts of the silicon layer;
   passing oxygen ions into an upper surface of the pad oxide film, and out of a lower surface of the pad oxide film to implant the oxygen ions into the silicon layer, using remaining parts of the first oxidation-resistance film as a mask, the parts of the silicon layer having the oxygen ions implanted therein being in direct contact with the lower surface of the pad oxide film, directly under, and completely covered by the pad oxide film, wherein the implanted oxygen ions have a peak concentration in a lower half of the silicon layer, the peak concentration being centered above the insulating film, so that all other concentrations of the implanted oxygen ions, both above and below the lower half of the silicon layer, are less than the peak concentration; and
   oxidizing the parts of the silicon layer into which the oxygen ions have been implanted, and while the parts are still covered by the pad oxide film, to form isolation regions dividing the silicon layer into a plurality of mutually isolated active regions.

7. The method of claim 6, wherein the silicon layer has a thickness of at most seventy nanometers.

8. The method of claim 6, wherein the semiconductor device is a fully depleted silicon-on-insulator device.

9. The method of claim 6, wherein the isolation regions are field oxide regions.

10. The method of claim 6, wherein the first oxidation-resistant film comprises at least one of a nitride film and a photoresist film.

11. The method of claim 6, further comprising:
    depositing a second oxidation-resistant film after the first oxidation-resistant film has been removed from said parts of the silicon layer; and
    etching the second oxidation-resistant film to leave sidewalls on vertical edges of the remaining parts of the first oxidation-resistant film before the oxygen ions are implanted.

12. The method of claim 11, wherein the second oxidation-resistant film is an oxide film or a nitride film.

13. The method of claim 6, wherein all parts of the silicon layer having the oxygen ions implanted therein are completely covered by the pad oxide film, and wherein during said oxidizing, the parts are completely covered by the pad oxide film.

* * * * *